United States Patent [19]

Kondo et al.

[11] Patent Number: 5,910,391
[45] Date of Patent: *Jun. 8, 1999

[54] PROCESS FOR MAKING LITHOGRAPHIC PRINTING PLATE WITH WATER WASH CONTAINING MERCAPTO COMPOUND

[75] Inventors: Toshiro Kondo; Yutaka Araki; Hajime Fujioka; Makiko Oko, all of Tokyo, Japan

[73] Assignee: Mitsubishi Paper Mills Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/907,087

[22] Filed: Aug. 6, 1997

[30] Foreign Application Priority Data

Aug. 7, 1996 [JP] Japan ..................................... 8-208307
Sep. 5, 1996 [JP] Japan ..................................... 8-235305

[51] Int. Cl.⁶ ................................. G03F 7/07; G03C 8/32
[52] U.S. Cl. ........................... 430/204; 430/248; 430/488
[58] Field of Search ..................................... 430/204, 248, 430/488

[56] References Cited

U.S. PATENT DOCUMENTS

| | | | |
|---|---|---|---|
| 4,567,131 | 1/1986 | Watkiss | 430/309 |
| 5,196,290 | 3/1993 | Coppens et al. | 430/204 |
| 5,200,294 | 4/1993 | De Keyzer et al. | 430/204 |
| 5,436,110 | 7/1995 | Coppens et al. | 430/204 |
| 5,445,914 | 8/1995 | Coppens et al. | 430/204 |

*Primary Examiner*—Richard L. Schilling
*Attorney, Agent, or Firm*—Pillsbury Madison & Sutro LLP

[57] ABSTRACT

Disclosed is a process for making a lithographic printing plate, which comprises subjecting a lithographic printing material having physical development nuclei between an aluminum support and a silver halide emulsion layer to exposure and then processing the lithographic printing material at least with a developing solution, a water washing solution and a finishing solution in this order, wherein the processing with the water washing solution is carried out by using a water washing solution containing a compound having a mercapto group or a thione group.

19 Claims, No Drawings

PROCESS FOR MAKING LITHOGRAPHIC PRINTING PLATE WITH WATER WASH CONTAINING MERCAPTO COMPOUND

BACKGROUND OF THE INVENTION

This invention relates to a process for making a lithographic printing plate using an aluminum plate as a support and utilizing the silver complex diffusion transfer process.

Some examples of a lithographic printing plate using the silver complex diffusion transfer process (the DTR process) are described on pages 101 to 130 of André Rott and Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two sheet type lithographic printing plate is described in detail in Japanese Provisional Patent Publication No. 158844/1982. Also, the mono-sheet type is described in detail in U.S. Pat. No. 3,728,114.

A mono-sheet type lithographic printing plate using an aluminum plate as a support and utilizing the silver complex diffusion transfer process (hereinafter referred to as "an aluminum lithographic printing plate"), which is the target of the present invention, is described in detail in Japanese Provisional Patent Publications No. 118244/1982, No. 158844/1982, No. 260491/1988, No. 116151/1991 and No. 282295/1992 and U.S. Pat. No. 4,567,131 and 5,427,889.

In the above aluminum lithographic printing plate, physical development nuclei are carried on a roughened and anodized aluminum support, and a silver halide emulsion layer is further provided thereon. A general process for making this lithographic printing plate comprises the steps of exposure, development processing, water washing processing (washing off: removal of a silver halide emulsion layer, hereinafter merely referred to as "washing processing") and finishing processing.

Specifically, metallic silver image portions are formed on physical development nuclei by development processing, and by washing processing subsequent thereto, a silver halide emulsion layer is removed to expose the metallic silver image portions (hereinafter referred to as "silver image portions") on an aluminum support. Simultaneously, the surface of anodized aluminum itself is exposed as non-image portions.

In order to protect the exposed silver image portions and non-image portions, a finishing solution containing a protective colloid such as gum arabic, dextrin, carboxymethyl cellulose and polystyrenesulfonic acid is coated thereon, i.e., said portions are subjected to the so-called gum coating processing. The finishing solution is also called as a fixing solution or a finisher and generally contains a compound which makes silver image portions oleophilic (hereinafter referred to as an oleophilic property-imparting agent).

As one of the problems of the above process for making an aluminum lithographic printing plate, there may be mentioned a problem that a water washing solution (hereinafter merely referred to as "washing solution") is made turbid. It has been found that such turbidity is caused by bringing a silver ion or a silver complex dissolved out in a developing solution into a washing solution. In the aluminum lithographic printing plate which is the target of the present invention, the efficiency of a silver complex trapped by physical development nuclei is lowered as compared with a conventional lithographic printing plate having physical development nuclei on a silver halide emulsion layer. Therefore, a large amount of a silver ion or a silver complex is dissolved out in a developing solution and brought into a washing solution.

As described above, washing processing is a step of removing a silver halide emulsion layer by peeling. Gelatin, chemically developed silver and so on which are peeled off from an aluminum support and dissolved or dispersed in a washing solution are recovered from the washing solution by a filter. The washing solution which has passed through the filter is generally circulated and used again. However, a silver ion or a silver complex cannot be recovered by the filter and makes the washing solution turbid. Further, there is an environmental problem in discharge of a treating liquid containing silver, and a measure to solve the problem has been demanded.

As other problems of the above process for making an aluminum lithographic printing plate, there may be mentioned a problem that the ink receptivity of silver image portions at the time of starting printing is low and a problem that printing endurance is insufficient. As a measure to solve the above problem of ink receptivity, it has been disclosed to incorporate an oleophilic property-imparting agent into a finishing solution in U.S. Pat. No. 5,436,110. Also, it has been described to incorporate an oleophilic property-imparting agent into a developing solution in the above publication. In U.S. Pat. No. 4,567,131, it has been disclosed to make a proteinase and an oleophilic property-imparting agent act in finishing processing.

By the above methods, ink receptivity has been improved to a certain extent. However, ink receptivity might be insufficient depending on change in printing conditions, for example, change in the kind of a printer, an ink or the like, and constantly stable and high ink receptivity has not yet been obtained. Therefore, further improvement has been demanded. With respect to the problem of printing endurance, desired property has not been obtained, and improvement of printing endurance has been demanded. Also, a conventional plate making process has a problem that ink receptivity is lowered with the lapse of time from plate making until printing.

SUMMARY OF THE INVENTION

An object of the present invention is to provide a process for making a lithographic printing plate, in which a washing solution is prevented from being turbid and no environmental problem is involved. Another object of the present invention is to provide a process for making an aluminum lithographic printing plate having stably high ink receptivity and excellent printing endurance. Still another object of the present invention is to provide a process for making a lithographic printing plate in which lowering of ink receptivity with the lapse of time from plate making until printing is suppressed.

The above objects of the present invention have been achieved by a process for making a lithographic printing plate, which comprises subjecting a lithographic printing material having physical development nuclei between an aluminum support and a silver halide emulsion layer to exposure and then processing the lithographic printing material at least with a developing solution, a water washing solution and a finishing solution in this order, wherein the processing with the water washing solution is carried out by using a water washing solution containing a compound having a mercapto group or a thione group.

It is considered that the compound having a mercapto group or a thione group is coordinated to a silver ion or a silver complex in the washing solution to enable capture and recovery using a filter.

It is an unexpected finding that the ink receptivity and printing endurance of silver image portions are improved by incorporating the compound having a mercapto group or a thione group into the washing solution. As described above, the compound having a mercapto group or a thione group has been known as an oleophilic property-imparting agent of silver image portions. However, it is an attempt which cannot be expected from the prior art to incorporate such an oleophilic property-imparting agent into the washing solution in the step of making an aluminum lithographic printing plate.

By incorporating the compound having a mercapto group or a thione group into the developing solution and/or the finishing solution in addition to the washing solution, ink receptivity and printing endurance is remarkably improved.

Further, by incorporating a proteinase into the washing solution and/or the finishing solution, ink receptivity is stably improved, and lowering of ink receptivity with the lapse of time from plate making until printing is suppressed.

DESCRIPTION OF THE PREFERRED EMBODIMENTS

In the following, the present invention is explained in detail.

As the compound having a mercapto group or a thione group to be used in the present invention, compounds described in Japanese Patent Publication No. 29723/1973 and Japanese Provisional Patent Publication No. 127928/1983 are preferably used. A nitrogen-containing heterocyclic compound having a mercapto group or a thione group is particularly preferred, and there may be mentioned a compound represented by the following formula:

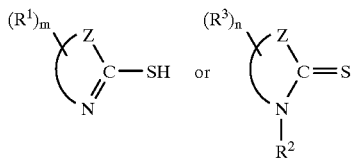

wherein $R^1$ and $R^3$ each independently represent an alkyl group having 3 or more carbon atoms, preferably 3 to 12 carbon atoms, an alkenyl group having 3 or more carbon atoms, preferably 3 to 12 carbon atoms, an acylamide group, an amino group, an aralkyl group or an aryl group; $R^2$ represents a hydrogen atom, an alkyl group having 3 or more carbon atoms, preferably 3 to 12 carbon atoms, an alkenyl group having 3 or more carbon atoms, preferably 3 to 12 carbon atoms, an aralkyl group or an aryl group; m and n each represent an integer of 1 or more, and when $R^2$ is an alkyl group having 3 or more carbon atoms, an alkenyl group, an aralkyl group or an aryl group, n may be 0; and Z represents atomic groups necessary for forming a 5- or 6-membered ring together with N and C in the formula such as C, N, O and S.

As a specific example of the 5- or 6-membered heterocyclic ring, there may be mentioned imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. The above heterocyclic ring may be a ring produced by condensing two or more rings such as bicyclic, tricyclic, etc. or may be fused with a benzene ring or a naphthalene ring. It is preferred that the 5- or 6-membered heterocyclic ring does not have a water-soluble group such as a carboxy group and a sulfo group.

As a specific example of the compound having a mercapto group or a thione group, there may be mentioned 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 2-mercapto-5-phenyl-1,3,4-oxadiazole, 5-mercapto-1-phenyl-tetrazole, 3-mercapto-4-methyl-6-phenyl-pyridazine, 2-mercapto-5,6-diphenyl-pyrazine, 2-mercapto-4,6-diphenyl-1,3,5-triazine and 2-amino-4-mercapto-6-benzyl-1,3,5-triazine, but the compound having a mercapto group or a thione group is not limited thereby.

In the present invention, by incorporating the compound having a mercapto group or a thione group into a washing solution, the washing solution is prevented from being turbid, silver can be recovered, and also ink receptivity and printing endurance are improved. The amount of the compound having a mercapto group or a thione group to be contained in the washing solution is suitably about 0.01 to 10 g/liter, more preferably 0.2 to 4 g/liter.

In order to further improve ink receptivity and printing endurance, the compound having a mercapto group or a thione group is further contained in a developing solution and/or a finishing solution. It is more preferred that the compound having a mercapto group or a thione group is contained in three processing solutions of the developing solution, the washing solution and the finishing solution. Further, the compound having a mercapto group or a thione group may be contained in a lithographic printing material.

The amount of the compound having a mercapto group or a thione group to be contained in the developing solution and the finishing solution is suitably about 0.01 to 10 g/liter.

The compound having a mercapto group or a thione group is dissolved in an alkaline solution, but it is not dissolved in a neutral to weakly acidic washing solution. Therefore, said compound is added by using a dissolving aid such as an organic solvent, an amine compound (e.g., amino alcohol), polyethylene glycol and a quaternary ammonium salt type cationic surfactant.

In the present invention, a proteinase is preferably contained in the washing solution and/or the finishing solution. As the proteinase (hereinafter referred to as "the enzyme") to be used in the present invention, there may be used known vegetable and animal enzymes which can hydrolyze protein such as gelatin. As an example of the enzyme, there may be mentioned pepsin, rennin, trypsin, chymotrypsin, cathepsin, papain, ficin, thrombin, renin, collagenase, bromelain and bacterioproteinase (e.g., Bioprase (trade name) produced by Nagase Sangyo Co., Japan). Among them, trypsin, papain, ficin and bacterioproteinase are particularly preferred. The amount of the enzyme to be contained in the washing solution and/or the finishing solution is suitably about 0.1 to 20 g/liter, more preferably 0.2 to 10 g/liter.

In the present invention, the washing solution may contain, in addition to the compound having a mercapto group or a thione group, a buffer for buffering the solution at a pH of 4 to 8, preferably in the range of 4.5 to 7, for example, a phosphate buffer, a citrate buffer or a mixture of them. Also, a preservative may be contained in the washing solution.

The washing solution is used for the purpose of completely removing a silver halide emulsion layer on an aluminum support. In general, a method of spraying a washing solution at 25 to 35° C. according to the jet system or a method of peeling an emulsion layer by a scrub roller while spraying a washing solution is employed. The emulsion layer peeled off from the aluminum support is dissolved or dispersed in the washing solution, once returned to a tank for storing the washing solution and circulated through a filter provided outside the system to be recovered by the filter.

In the aluminum lithographic printing plate, removal of the silver halide emulsion layer by water washing is an extremely important step in order to completely expose silver image portions and non-image portions constituted by the surface of aluminum itself. In particular, strong oleophilic property is necessary for ink receptive silver image portions so that it is necessary to completely remove substances inhibiting the oleophilic property of gelatin or the like.

The developing solution to be used in the present invention may contain, in addition to the compound having a mercapto group or a thione group, additives such as a developing agent, for example, polyhydroxybenzenes and 3-pyrazolidinones; an alkaline substance, for example, potassium hydroxide, sodium hydroxide, lithium hydroxide and sodium tertiary phosphate; an amine compound; a preservative, for example, sodium sulfite; a viscosity modifier, for example, carboxymethyl cellulose; an antifoggant, for example, potassium bromide; a development modifier, for example, a polyoxyalkylene compound; and a silver halide solvent, for example, thiosulfate, thiocyanate, cyclic imide, thiosalicylic acid and a mesoionic compound. The pH of the developing solution is generally 10 to 14, preferably 12 to 14.

In order to heighten the respective oleophilic properties and hydrophilic properties of the silver image portions and the non-image portions exposed by development processing and washing processing and also in order to protect a plate surface, said portions are subjected to processing using the finishing solution. In the present invention, the finishing solution may preferably contain, in addition to the compound having a mercapto group or a thione group and the proteinase, a protective colloid such as gum arabic, dextrin, sodium alginate, a propylene glycol ester of alginic acid, hydroxyethyl starch, carboxymethyl cellulose, hydroxyethyl cellulose, polyvinyl pyrrolidone, polystyrenesulfonic acid and polyvinyl alcohol in order to protect an anodized layer of the non-image portions and improve the hydrophilic property thereof.

The lithographic printing plate which is the target of the present invention has physical development nuclei and the silver halide emulsion layer on the aluminum support. A silver halide emulsion is selected from generally used silver chloride, silver bromide, silver iodide, silver chlorobromide, silver chloroiodobromide, silver iodobromide and so on, and an emulsion mainly comprising silver chloride (which means a silver halide emulsion comprising 50 mole % or more of silver chloride) is preferred. The type of the emulsion may be either negative type or positive type. The above silver halide emulsion can be chemically sensitized or spectrally sensitized, if necessary.

The silver halide emulsion layer may contain the compound having a mercapto group or a thione group. Gelatin is preferably used as a hydrophilic colloid of the silver halide emulsion layer when silver halide particles are prepared. As the gelatin, there may be used various gelatins such as acid-treated gelatin and alkali-treated gelatin. Also, modified gelatins thereof (e.g., phthalated gelatin and amidated gelatin) can be used. Further, a hydrophilic high molecular weight compound such as polyvinyl pyrrolidone, various starches, albumin, polyvinyl alcohol, gum arabic and hydroxyethyl cellulose can be contained. As the hydrophilic colloid, a hydrophilic colloid substantially containing no hardener is desirably used in order to facilitate peeling of the silver halide emulsion layer after development.

The aluminum support to be used in the present invention is a roughened and anodized aluminum plate, and an aluminum support described in U.S. Pat. No. 5,427,889 is preferably used.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and preparation process thereof, reference can be made to, for example, André Rott and Edith Weyde, "Photographic Silver Halide Diffusion Processes", published by the Focal Press, London and New York (1972).

In the present invention, a water-swellable intermediate layer described in Japanese Provisional Patent Publication No. 116151/1991 may be provided between the physical development nuclei layer and the silver halide emulsion layer.

EXAMPLES

The present invention is described in detail by referring to Examples.

Example 1

According to the methods described in U.S. Pat. No. 5,427,889 which is incorporated as a reference herein, electrolytic roughening treatment and anodization of an aluminum plate were carried out to obtain an aluminum support having a thickness of 0.30 mm and having about 5,600/100 $\mu m^2$ of pits with a diameter of 0.03 to 0.30 $\mu m$ on a plateau with an average diameter of about 5 $\mu m$, wherein the average diameter of the pits was 0.08 $\mu m$. The aluminum support was obtained by being anodized after roughening treatment and had an average roughness (Ra) measured by JIS B 0601 (1994) of 0.5 to 0.6 $\mu m$.

On the aluminum support, a physical development nuclei solution comprising silver sol prepared by the Carey Lea method was coated and then dried. The amount of silver contained in a physical development nuclei layer was 3 mg/m$^2$.

As a silver halide emulsion, a silver chloroiodobromide emulsion (20 mole % of AgBr and 0.4 mole % of AgI) having an average particle size of 0.2 $\mu m$, with which 0.006 mmole of potassium hexachloroiridate (IV) per 1 mole of silver was doped, was prepared by the control double jet method. As a protective colloid, alkali-treated gelatin was used. Further, the emulsion was subjected to sulfur-gold sensitization and spectrally sensitized by using 3 mg of a sensitizing dye represented by the following formula per 1 g of silver.

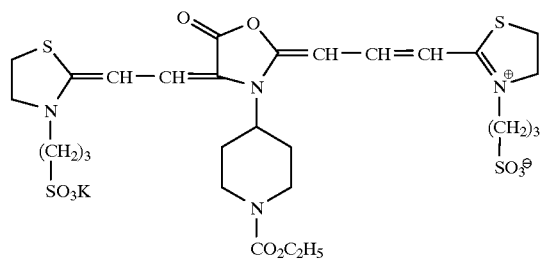

A surfactant was added to the silver halide emulsion prepared as described above, and the mixture was coated on the aluminum support on which the above physical development nuclei had been coated, so that the amount of silver became 2 g/m$^2$, followed by drying, to obtain a lithographic printing material.

On the lithographic printing material, an image was outputted by an outputting machine using a red LD laser of 633 nm as a light source. Then, the lithographic printing material was processed by a processor for plate making (a SLT-N automatic developing machine (trade name) manufactured by Du Pont Co.) to obtain a lithographic printing plate. In the processor for plate making, a step of development processing (dipping at 21° C. for 30 seconds), a step of washing processing (peeling an emulsion layer by a scrub roller while showering and jetting a washing solution at 33° C. for 10 seconds), a step of finishing processing (showering at 21° C. for 5 seconds) and a drying step are carried out.

The apparatus for the water washing step is constituted by a tank for storing 30 liter of a washing solution; a unit in which the washing solution is fed from the tank to a lithographic printing material by using a pump; and a unit in which the washing solution is circulated from the tank through a filter provided outside the system. As the filter, a cylindrical filter having a pore size of 5 μm was used.

The state of turbidity of the washing solutions when 100 m$^2$ of the lithographic printing plate was processed by using the following developing solution, washing solutions and finishing solution was observed.

| <Developing solution A> | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanolamine | 6 g |
| Anhydrous sodium thiosulfate | 6 g |
| Sodium ethylenediaminetetraacetate | 5 g |
| Polyethylene glycol (average molecular weight: 400) | 10 g |

Made up to 1,000 cc in total with addition of water. The pH was adjusted to 13.0.

| <Washing solution A> | |
|---|---|
| Sodium bisulfite | 10 g |
| Potassium primary phosphate | 40 g |

Made up to 1,000 cc in total with addition of water. The pH was adjusted to 6.0.

| <Washing solution B> | |
|---|---|
| 2-Mercapto-5-n-heptyl-oxadiazole | 0.5 g |
| Triethanolamine | 13 g |
| Sodium bisulfite | 10 g |
| Potassium primary phosphate | 40 g |

Made up to 1,000 cc in total with addition of water. The pH was adjusted to 6.0.

| <Finishing solution A> | |
|---|---|
| Gum arabic | 10 g |
| Sodium primary phosphate | 10 g |

Made up to 1,000 cc in total with addition of water. The pH was adjusted to 6.0.

As a result of the above processings, although the washing solution A containing no compound having a mercapto group or a thione group was turbid, the washing solution B containing the compound having a mercapto group or a thione group (2-mercapto-5-n-hepty-oxadiazole) was not turbid at all.

With respect to the lithographic printing plates prepared by the process described above, ink receptivity (inking) at the time of starting printing was evaluated under printing conditions giving relatively bad ink receptivity, obtained by experience, i.e., by using a printer Heidelberg TOK (a trade name of an offset printing press manufactured by Heidelberg Co.), an ink New Champion Black H (trade name, produced by Dainippon Ink Co., Japan) and commercially available damping water for a PS plate. The ink receptivity was evaluated by the number of sheets printed until the density of images became stable after printing was started.

As a result, in the lithographic printing plate processed by using the washing solution A, sheets were not inked even 50 sheets were printed. However, in the lithographic printing plate processed by using the washing solution B of the present invention, sheets were stably inked after 27 sheets were printed.

Example 2

Procedures were carried out in the same manner as in Example 1 except for preparing and using a washing solution C to which 3-mercapto-5-nonyl-1,2,4-triazole was added and a washing solution D to which 3-pentylbenzoxazoline-2-thione was added in place of 2-mercapto-5-n-heptyl-oxadiazole of the washing solution B, respectively. As a result, neither the washing solution C nor D became turbid. With respect to ink receptivity, the same results as in the case of using the washing solution B were obtained.

Example 3

Procedures were carried out in the same manner as in Example 1 except for using the developing solution, the washing solution and the finishing solution used in Example 1 and the following developing solution and finishing solution.

<Developing solution B>

A developing solution B was prepared by adding 0.5 g of 2-mercapto-5-n-heptyl-oxadiazole to the developing solution A.

<Finishing solution B>

A finishing solution B was prepared by adding 1 g of 2-mercapto-5-n-heptyl-oxadiazole and 26 g of triethanolamine to the finishing solution A.

With respect to the lithographic printing plates prepared by the process described above, ink receptivity was evaluated according to the method of Example 1. Also, printing endurance was evaluated by the following method.

Printing endurance was evaluated by the number of printed sheets when printing was carried out according to the above printing method and lacking of fine dot image portions occurred to make printing impossible, based on the following evaluation standard.
⊚: 100,000 sheets or more
O: 50,000 to less than 100,000 sheets
Δ: 10,000 to less than 50,000 sheets
X: less than 10,000 sheets The evaluation results of ink receptivity and printing endurance are shown in Table 1.

TABLE 1

| Sample No. | Developing solution | Washing solution | Finishing solution | Ink receptivity | Printing endurance | Remarks |
|---|---|---|---|---|---|---|
| 1 | A | A | A | 50 sheets or more | X | Comparative |
| 2 | B | A | A | 40 sheets | Δ | Comparative |
| 3 | A | A | B | 28 sheets | Δ | Comparative |
| 4 | B | A | B | 26 sheets | o | Comparative |
| 5 | B | B | A | 10 sheets | ⊚ | Present invention |
| 6 | A | B | B | 9 sheets | ⊚ | Present invention |
| 7 | B | B | B | 5 sheets | ⊚ | Present invention |

As can be clearly seen from the above results, according to the present invention, ink receptivity and printing endurance are improved as compared with conventional processings, by incorporating the compound having a mercapto group or a thione group into the washing solution and further into the developing solution and/or the finishing solution.

Example 4

Procedures were carried out in the same manner as in Example 3 except for using the washing solution C or D prepared in Example 2, respectively, but the same results as in Example 3 were obtained in each case.

Example 5

A washing solution E was prepared by adding 2 g of a bacterioproteinase Bioprase AL-15 (trade name, produced by Nagase Sangyo Co., Japan) as a proteinase to the washing solution B. Procedures were carried out in the same manner as in Example 3 except for using the developing solution A, the washing solution E and the finishing solution A. As a result, the number of sheets printed until the density of images became stable was 19, and there was no problem in printing endurance even when 100,000 sheets were printed.

Example 6

Procedures were carried out in the same manner as in Example 5 except for using trypsin in place of Bioprase AL-15 of the washing solution E. As a result, the same results as in Example 5 were obtained.

Example 7

Procedures were carried out in the same manner as in Example 3 except for using the developing solution B, the washing solution E and the finishing solution B. As a result, the number of sheets printed until the density of images became stable was 5, and there was no problem in printing endurance even when 100,000 sheets were printed.

Example 8

A finishing solution C was prepared by adding 2 g of Bioprase AL-15 as a proteinase to the finishing solution A. Procedures were carried out in the same manner as in Example 3 except for using the developing solution A, the washing solution B and the finishing solution C. As a result, the number of sheets printed until the density of images became stable was 15, and there was no problem in printing endurance even when 100,000 sheets were printed.

Example 9

Procedures were carried out in the same manner as in Example 8 except for using trypsin in place of Bioprase AL-15 of the washing solution C. As a result, the same results as in Example 8 were obtained.

Example 10

Procedures were carried out in the same manner as in Example 3 except for using the developing solution B, the washing solution B and the finishing solution C. As a result, the number of sheets printed until the density of images became stable was 9, and there was no problem in printing endurance even when 100,000 sheets were printed.

Comparative Example 1

The following procedures were carried out as a comparative example.

A finishing solution D was prepared by adding 2 g of Bioprase AL-15 to the finishing solution B. Procedures were carried out in the same manner as in Example 3 except for using the developing solution A, the washing solution A and the finishing solution D. As a result, the number of sheets printed until the density of images became stable was 25, and the number of sheets when lacking of fine dot image portions occurred to make printing impossible was about 50,000.

Example 11

After the lithographic printing plates prepared in Examples and Comparative example described above were left to stand for 1 week, ink receptivity was evaluated. The results are shown in Table 2.

TABLE 2

| Sample | Ink receptivity after leaving to stand for 1 week |
|---|---|
| Comparative example 1 | 40 sheets |
| Example 7 | 7 sheets |
| Example 10 | 11 sheets |

As can be clearly seen from the above results, according to the present invention, lowering of ink receptivity of the lithographic printing plate with the lapse of time after plate making is suppressed.

We claim:

1. A process for making a lithographic printing plate, which comprises subjecting a lithographic printing material having physical development nuclei between an aluminum support and a silver halide emulsion layer to exposure and then processing the lithographic printing material at least with a developing solution, a water washing solution and a finishing solution in this order,
wherein the processing with the water washing solution is carried out by using a water washing solution prepared by adding a nitrogen-containing heterocyclic compound having a mercapto group or a thione group to a fresh washing solution, and having a pH of 4 to 8.

2. The process according to claim 1, wherein the nitrogen-containing heterocyclic compound having a mercapto group or a thione group is a compound represented by the formula:

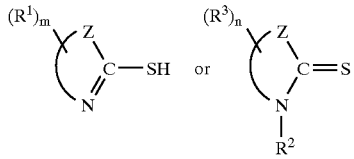

wherein $R^1$ and $R^3$ each independently represent an alkyl group, an alkenyl group, an acylamide group, an amino group, an aralkyl group or an aryl group; $R^2$ represents a hydrogen atom, an alkyl group, an alkenyl group, an aralkyl group or an aryl group; m and n each represent an integer of 1 or more, and when $R^2$ is an alkyl group, an alkenyl group, an aralkyl group or an aryl group, n may be 0; and Z represents atomic groups necessary for forming a 5- or 6-membered ring together with N and C in the formula.

3. The process according to claim 2, wherein Z forms, with N and C, a 5- or 6-membered ring selected from the group consisting of imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine rings, which may be produced by condensing two or more rings or fused with a benzene ring or a naphthalene ring.

4. The process according to claim 1, wherein the nitrogen-containing heterocyclic compound having a mercapto group or a thione group is a compound selected from the group consisting of 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 5-mercapto-1-phenyl-tetrazole, 3-mercapto-4-methyl-6-phenyl-pyridazine, 2-mercapto-5,6-diphenyl-pyrazine, 2-mercapto-4,6-diphenyl-1,3,5-triazine and 2-amino-4-mercapto-6-benzyl-1,3,5-triazine.

5. The process according to claim 1, wherein the nitrogen-containing heterocyclic compound having a mercapto group or a thione group is contained in the water washing solution in an amount of 0.01 to 10 g/liter.

6. The process according to claim 1, wherein the water washing solution further contains a buffer which buffers pH in the range of 4 to 8.

7. The process according to claim 6, wherein the buffer is a phosphate buffer, a citrate buffer or a mixture thereof.

8. The process according to claim 1, wherein at least one of the developing solution and the finishing solution contains a nitrogen-containing heterocyclic compound having a mercapto group or a thione group.

9. The process according to claim 8, wherein the nitrogen-containing heterocyclic compound having a mercapto group or a thione group is a compound represented by the formula:

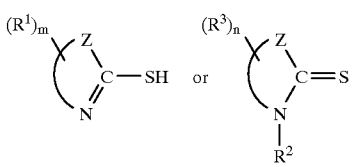

wherein $R^1$ and $R^3$ each independently represent an alkyl group, an alkenyl group, an acylamide group, an amino group, an aralkyl group or an aryl group; $R^2$ represents a hydrogen atom, an alkyl group, an alkenyl group, an aralkyl group or an aryl group; m and n each represent an integer of 1 or more, and when $R^2$ is an alkyl group, an alkenyl group, an aralkyl group or an aryl group, n may be 0; and Z represents atomic groups necessary for forming a 5- or 6-membered ring together with N and C in the formula.

10. The process according to claim 9, wherein Z forms, with N and C, a 5- or 6-membered ring selected from the group consisting of imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine rings, which may be produced by condensing two or more rings or fused with a benzene ring or a naphthalene ring.

11. The process according to claim 8, wherein the nitrogen-containing heterocyclic compound having a mercapto group or a thione group is a compound selected from the group consisting of 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 5-mercapto-1-phenyl-tetrazole, 3-mercapto-4-methyl-6-phenyl-pyridazine, 2-mercapto-5,6-diphenyl-pyrazine, 2-mercapto-4,6-diphenyl-1,3,5-triazine and 2-amino-4-mercapto-6-benzyl-1,3,5-triazine.

12. The process according to claim 8, wherein the nitrogen-containing heterocyclic compound having a mercapto group or a thione group is contained in the developing or finishing solution in an amount of 0.01 to 10 g/liter.

13. The process according to claim 1, wherein at least one of the water washing solution and the finishing solution contains a proteinase.

14. The process according to claim 13, wherein the proteinase is at least one selected from the group consisting of pepsin, rennin, trypsin, chymotrypsin, cathepsin, papain, ficin, thrombin, renin, collagenase, bromelain and bacterio-proteinase.

15. The process according to claim 14, wherein the proteinase is trypsin, papain, ficin or bacterioproteinase.

16. The process according to claim 13, wherein at least one of the water washing solution and the finishing solution contains a proteinase in an amount of 0.1 to 20 g/liter.

17. The process according to claim 1, wherein said compound having a mercapto group or a thione group is water-insoluble and said process further includes the step of employing a dissolving aid to dissolve said compound having a mercapto group or a thione group in the washing solution.

18. The process according to claim 1, wherein the washing solution contains the compound having a mercapto group or a thione group in an amount of 0.2 to 4 g/liter.

19. A process for making a lithographic printing plate, which comprises subjecting a lithographic printing material having physical development nuclei between an aluminum support and a silver halide emulsion layer to exposure, preparing a fresh washing solution by adding a nitrogen-containing heterocyclic compound having a mercapto group or a thione group, said fresh water washing solution having a pH of 4 to 8, and processing the lithographic printing material at least with a developing solution, said water washing solution and a finishing solution in this order.

* * * * *